United States Patent [19]
Tong et al.

[11] Patent Number: 5,208,593
[45] Date of Patent: May 4, 1993

[54] METHOD AND STRUCTURE FOR DECODING HUFFMAN CODES USING LEADING ONES DETECTION

[75] Inventors: Po Tong, Fremont; Peter A. Ruetz, Redwood City, both of Calif.

[73] Assignee: LSI Logic Corporation, Milpitas, Calif.

[21] Appl. No.: 905,257

[22] Filed: Jun. 26, 1992

Related U.S. Application Data

[63] Continuation-in-part of Ser. No. 737,959, Jul. 30, 1991, and a continuation-in-part of Ser. No. 737,620, Jul. 30, 1991, Pat. No. 5,181,031.

[51] Int. Cl.⁵ ............................................. H03M 7/40
[52] U.S. Cl. ......................................... 341/65; 341/67
[58] Field of Search .............................. 341/65, 67, 95

[56] References Cited

U.S. PATENT DOCUMENTS

| | | | |
|---|---|---|---|
| 3,883,847 | 5/1975 | Frank | 341/65 |
| 4,396,906 | 8/1983 | Weaver | 341/65 |
| 4,616,211 | 10/1986 | Ross | 341/67 |
| 4,899,149 | 2/1990 | Kahan | 341/67 |

OTHER PUBLICATIONS

Ruetz et al., "A Video-Rate JPEG Chip Set," LSI Logic Corporation, pp. 1-11.
Lu et al., "An Encoding Procedure and a Decoding Procedure for a New Modified Huffman Code," Jan. 1990, vol. 38, No. 1, IEEE Transactions on Acoustics, Speech, and Signal Processing, pp. 128-136.

*Primary Examiner*—Marc S. Hoff
*Attorney, Agent, or Firm*—Skjerven, Morrill, MacPherson, Franklin & Friel

[57] ABSTRACT

A method and a structure are provided for decoding Huffman codes using a random access memory having a size less than twice the total number of codewords decodable. Under this method, the number of leading 1's in a Huffman codeword and the bits of the Huftman code word other than the leading 1's ("remainder") are combined to form an address into the random access memory. Using the fact that, for a given number of leading 1's in a Huffman code, the possible remainder of the Huffman code is no longer than a predetermined number of bits, the size of the random access memory necessary for decoding such Huffman codes can be made optimally small.

12 Claims, 2 Drawing Sheets

METHOD AND STRUCTURE FOR DECODING HUFFMAN CODES USING LEADING ONES DETECTION

CROSS REFERENCE TO RELATED APPLICATIONS

This application is a continuation-in-part Application of a copending Application ("'959 Application") entitled "Method and Apparatus for Decoding Huffman Codes," by P. Ruetz and P. Tong, Ser. No. 07/737,959, filed on Jul. 30, 1991, assigned to LSI Logic, which is also the assignee of the present Application. The disclosure of the copending '959 Application is hereby incorporated by reference in its entirety.

This application is also a Continuation-in-part Application of a copending Application ("'620 Application") entitled "Method and Apparatus for Decoding Huffman Codes by Detecting a Special Class," P. Tong and R. Ruetz, Ser. No. 07/737,620, filed Jul. 30, 1991, now U.S. Pat. No. 5,181,031, assigned to LSI Logic, which is also the assignee of the present Application. The disclosure of the copending '620 Application is hereby incorporated by reference in its entirety.

BACKGROUND OF THE INVENTION

1. Field of the Invention

The present invention relates to structures and methods for decoding variable length codes, and in particular relates to structures and methods for decoding Huffman codes in data compression and decompression applications.

2. Discussion of Related Art

Huffman codes or codewords are space-efficient variable length binary representations of data. An example of Huffman code use is found in the "JPEG Digital Compression and coding of Continuous-tone Still Images, Draft ISO 10918, 1991" by the Joint Picture Expert Group (JPEG) of the ANSI X3L2.8 committee. In Annex C of the above JPEG Document, JPEG specifies a particular way to generate Huffman code tables for use with entropy encoding of still pictures. Various circuits have been developed to decode Huffman codes. In general, these circuits either decode a Huffman code iteratively using sequential logic (i.e. one or two bits at a time, until the last bit of the code is recognized), or in parallel (i.e. decode the entire code in one clock period) using combinatorial logic. The latter method of decoding Huffman codes is known as "fast decoding."

One method in the prior art for fast decoding Huffman codes is illustrated in FIG. 1. As shown in FIG. 1, a circuit 100 is provided with an alignment buffer 101, a content-addressable memory (CAM) 102 and a random access memory (RAM) 103. The alignment buffer 101 receives a set of bits containing at least one Huffman code of length L, which lies anywhere within the W-bit input word (L<W) on the terminals of bus 104. The width W of the alignment buffer 101's input word is the maximum width for which a Huffman codeword may be received by this circuit 100. Upon receiving the Huffman codeword, the alignment buffer 101 provides an output word at its output bus 105. This output word on bus 105 is the input Huffman codeword shifted such that the first bit of the Huffman code is aligned to be the first bit of the output word on bus 105 from alignment buffer 101 The memory location in CAM 102, which is addressed by the W bits on the bus 105, contains an n-bit address. This n-bit address is then used on bus 106 to address RAM 103. The size of RAM 103 is determined by the number of accepted Huffman codewords, which is between $2^{n-1}$ and $2^n$ in this example, where n is an integer representing the number of bits in each address in RAM 103. The word in RAM 103 corresponding to the n-bit address on bus 106 contains both the length L and the decoded value of the Huffman code. The length L of the Huffman code thus decoded can then be fed back on the bus 107 to the alignment buffer 101 for aligning the next Huffman code contained in the input word on bus 104.

The approach taken by the prior art, e.g. in circuit 100 of FIG. 1, depends on the availability of an efficiently implemented CAM. CAMs are not readily available in some technologies. Without using a CAM, in order to achieve fast decoding, all the bits of a Huffman codeword would have to be used to address a RAM. The size of such a RAM is impractical and enormous.

SUMMARY OF THE INVENTION

In accordance with the present invention, a method and a structure are provided to decode a Huffman code using a random access memory (RAM). The present invention detects the number of leading 1's in a Huffman code, and uses this number of leading 1's to derive a maximum length of the Huffman code corresponding to the number of leading 1's and an address in the RAM at which all Huffman codes having the detected number of leading 1's are stored as a group. This maximum length of the Huffman code is used to extract the "remainder", which is the bits in the Huffman code excluding the leading 1's and the following '0' bit. The present invention uses both the address derived above and the bits of the remainder to obtain the address in the RAM specific to the Huffman code to be decoded.

In one embodiment of the present invention, the number of leading 1's detected in the Huffman code is used to look up the starting address of the decoded values of the Huffman codewords having the detected number of leading 1's. This starting address is added to an offset derived from the remainder. In this embodiment, the remainder bits are provided in reversed order from the order in the Huffman code in order to save an otherwise necessary shifting step.

For a given number of Huffman codewords, the present invention achieves a RAM size which is less than twice this number of decodable Huffman codewords. The present invention achieves an optimal minimum memory requirement, which is the least number of memory locations necessary to decode a given number of Huffman code.

The present invention is better understood upon consideration of the following detailed description and the accompanying drawings.

DETAILED DESCRIPTION OF THE PREFERRED EMBODIMENTS

Figure 1:
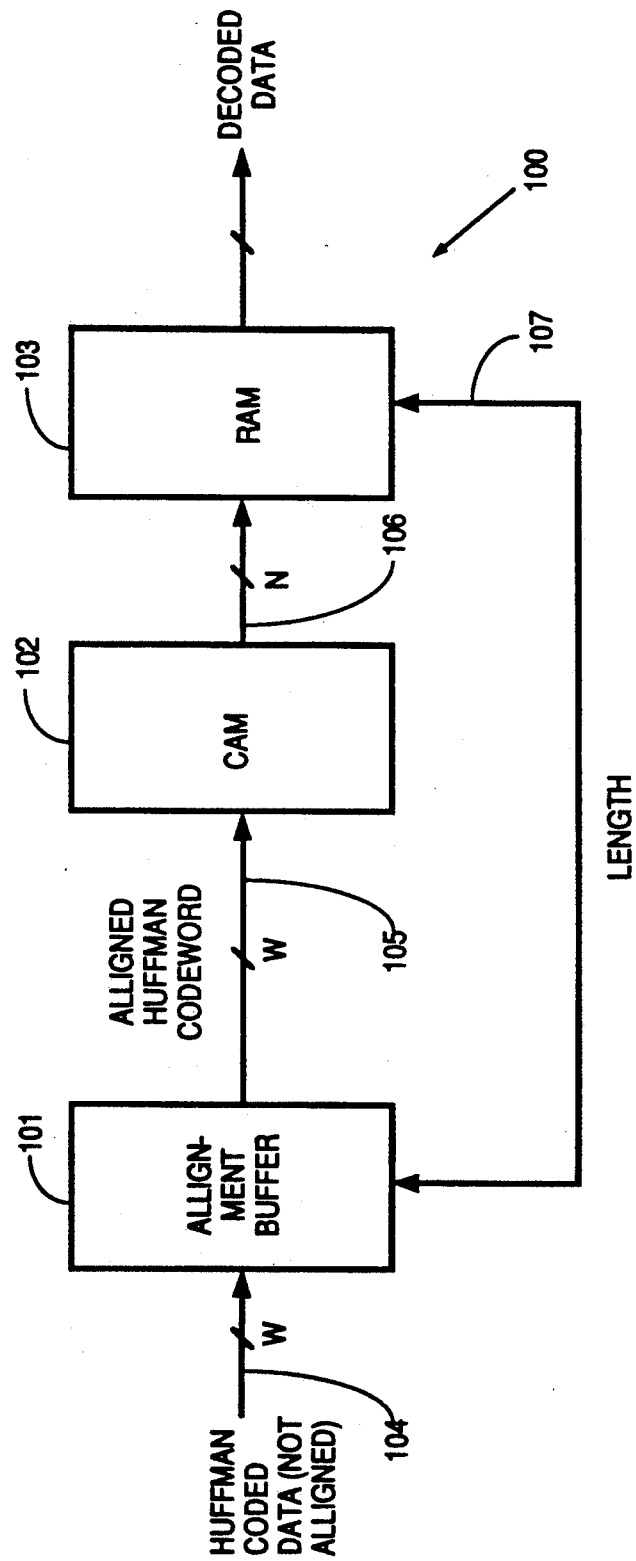
FIG. 1 is a block diagram of a circuit 100 in the prior art for fast decoding a Huffman code word.

The present invention is applicable to a class of Huffman codes which can be generated according to the procedure defined in Annex C of "JPEG Digital Compression and Coding of Continuous-tone Still Images Draft ISO 10918, 1991". Annex C of this JPEG document is hereby incorporated by reference in its entirety. In the following description it is understood that the term "Huffman Code" or "Huffman codeword" refers to a Huffman code or Huffman codeword belonging to such code or codeword described by the procedure in Annex C of the JPEG document incorporated by reference above.

A circuit in accordance with the present invention decodes a Huffman codeword ("codeword") of up to a predetermined maximum length by first detecting which one of a number of classes ("leading 1 classes") the codeword belongs, according to the number of leading 1's in the binary representation of the codeword. In general, the codewords of a given maximum length can be assigned an integer class number ranging between 0 and c-1, where c is a selected integer less than the given maximum length. The classes 0, 1, 2, . . . c-1 respectively contain as members codewords having 0, 1, 2, . . . , c-1 leading 1's Once the class number is recognized, the leading 1's are not needed for further decoding of the codeword. The bit immediately following the leading 1's is necessarily '0' in each class, except class c-1, where no bit immediately following the leading 1's needs to exist at all. Consequently, for classes 0, 1, . . . , c-2, this '0' bit following the leading 1's is also not necessary for further decoding of the Huffman codeword. Therefore, the circuit of the present invention derives a "remainder" by removing from the codeword, for the classes 0, 1, . . . , c-2, both the leading 1's and the bit immediately following the leading 1's. For the class c-1, no remainder is obtained by removing the leading 1's.

In each class, the lengths of the remainders vary according to the set of Huffman codewords accepted. The "maximum remainder length" (i.e. the number of bits required to represent all possible remainders in the class), can be determined in advance. This maximum remainder length is, for classes other than class c-1, is one less than the "maximum tail length," which is the maximum length of the class after the leading 1's are removed. The maximum tail length for class c-1 is zero.

Compact code tables can be achieved using both the class number and the remainder to form an address into a memory system. In particular, if the total number K of Huffman codewords is known, the present invention provides a code table having the least number of memory locations of all code tables suitable for decoding any set of K Huffman codes. Because both the detection of leading 1's in the codeword and the memory access using the class number and the remainder can be readily achieved by combinational logic, the present invention also provides fast decoding of the Huffman codeword.

For each class i, the Huffman codewords within the class can be decoded by indexing into $2^{m_i-1}$ locations of a random access memory (RAM), where $m_i$ is the maximum tail length of the Huffman codewords in class i. Thus, the maximum number of memory locations required for decoding the entire set of Huffman codewords is provided by summing over all leading 1 classes:

$$\sum_{i=0}^{n_k-1} 2^{m_i-1} + 1$$

where nk is the maximum number of leading 1's in any codeword of the Huffman code. (The last term in the above expression results from the fact that class c-1 has $n_k$ leading 1's and a zero length maximum tail length). The number of memory locations can be shown not to exceed $2K - \lceil \log_2 K \rceil - 1$. However, even this upper bound is in fact not tight. The least number of memory locations ("minimum memory requirement") required to decode any K Huffman codewords can be obtained using the following procedure.

Step 1: Find a value m, such that $2^{m-1} + m \leq K \leq 2^m + m$. Of the K Huffman codewords, $2^{m-1} + m$ codewords are to be assigned to $m+1$ classes having maximum tail lengths of 0, 1, 2, . . . m. Until final class assignment is made at Step 4 below, classes are assigned respectively to temporary variables $\overline{m}_i$, for i=0, 1, 2, . . . m. The number of remaining codewords, designated by running sum $K_{j+1}$, equals $K - 2^{m-1} - m$. The index j is a running index of the number of leading 1 classes assigned so far. Under this scheme, leading 1 classes of maximum tail lengths upto m are always assigned. At this step, j=m.

Step 2: If there is no remaining unassigned codewords, i.e. $K_{j+1} = 0$, go to Step 4. Otherwise, increase j by 1.

Step 3: Find an integer $\overline{m}_j$, that $2^{\overline{m}_j-2} + 1 \leq K_{j+1} \leq 2^{\overline{m}_j-1}$ and set $K_{j+1} = K_j - 2^{\overline{m}_j-2} - 1$. The integer $\overline{m}_j$ represents a maximum tail length in a new leading 1 class assigned. Go to Step 2.

Step 4: All leading 1 classes are now assigned. The value $n_k$, corresponding to maximum number of leading 1s in the set of Huffman code to be decoded, is set to j. Maximum tail lengths are assigned to the leading 1 classes i=0, 1, 2, . . . , $n_k$ respectively by setting $\overline{m}_i = \overline{m}_{n_K-i}$.

The above procedure yields a minimum memory requirement of:

$$2(K - n_K - 1) + \sum_{\substack{i=0, \\ \overline{m}_i \leq 1}}^{n_K} 1$$

Thus, since the last term in the above expression is always less than $n_k + 1$, the minimum memory requirement achieved by the above procedure is always less than twice the number of Huffman codewords to be decoded.

The JPEG "baseline sequential algorithm" defines (i) two programmable "AC" code tables, each having a maximum code length of 12 and each containing 13 code words; and ii) two programmable "DC" code tables, each having a maximum code length of 16 and each containing 163 code words. Using the above procedure, each AC code table has a minimum memory requirement of 17 memory locations and each DC code table has a minimum memory requirement of 305 memory locations.

In the above example, the maximum remainder lengths for the six leading 1 classes of the JPEG AC code table are respectively 1,4,3,2,1,0. Likewise, the maximum tail lengths for the twelve leading 1 classes of the JPEG DC code table are respectively 1,5,6,8,7,6,5,4,3,2,1,0. Because in each of the AC and DC code tables, the last leading 1 class has zero maximum tail length and therefore requires no memory location, the minimum memory requirements for each AC and each DC code tables are 16 and 304 memory locations respectively. In other words, the above procedure provides that the Huffman codewords of the JPEG baseline sequential algorithm can be decoded using a RAM having a total of 640 memory locations. As compared to the embodiments shown in the copending '620 Application incorporated by reference above, this minimum memory requirement is 75% smaller. Further, this minimum memory requirement can also be shown to be optimally small.

Figure 2:
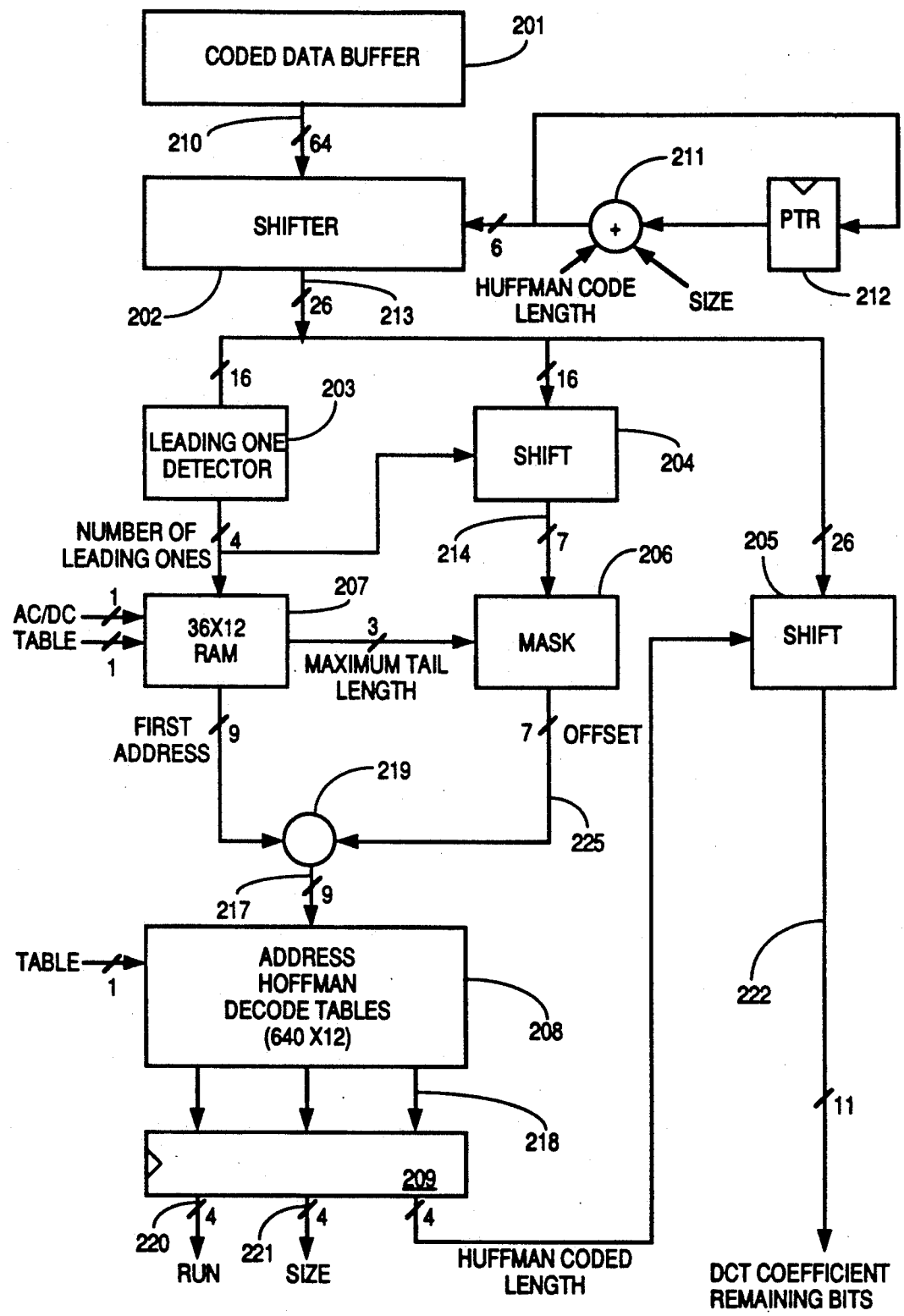
FIG. 2 is a block diagram of a circuit 200 for decoding a Huffman code in accordance with the present invention.

FIG. 2 shows one embodiment of the present invention in circuit 200. As shown in FIG. 2, a coded data buffer 201 receives words in a coded bit stream, which contains the next Huffman codeword to be decoded. Each word in the coded bit stream comprises a variable length Huffman codeword, the size of a non-zero DCT (discrete cosine transform) coefficient to follow, and the bits of the non-zero DCT coefficient.

Shifter 202 receives 64 bits of the coded bit stream from coded data buffer 201 and aligns on 26-bit bus 213 the current word to be decoded. This alignment is achieved by shifting out the most recently decoded word. The number of bits to shift for the alignment is obtained by adding to the beginning position of the most recently decoded Huffman codeword both the length of the most recently decoded Huffman code word and the size of the corresponding non-zero DCT coefficient. This beginning position of the most recently decoded Huffman codeword is stored in register 212.

Since the maximum length of a codeword under the JPEG sequential baseline algorithm is 16-bit, 16 bits of 26-bit bus 213 are provided to leading 1 detector 203 to provide a 4-bit output datum on bus 216. This 4-bit output datum on bus 216 encodes the number of leading 1's detected. Shifter 204 selects from the 16 bits of bus 213 the remainder of the Huffman codeword and provide this remainder on 7-bit bus 214. At the same time, the 4-bit datum of bus 216 is used to look up the maximum tail length for the corresponding leading 1 class detected in a 56X13 RAM 207. The 7-bit datum on bus 214, after being masked in mask 206 to set to zero the bits on bus 214 not belonging to the current Huffman codeword, are provided as a 7-bit output datum on bus 215. To allow this 7-bit datum to be used as a memory address offset, the masked 7-bit output datum is provided on bus 215 in reverse order from the 7-bit datum on bus 214, thereby eliminating the need to shift out the zeroed bits.

RAM 207 provides a 9-bit address, which corresponds to the memory location of the first decoded Huffman codeword in the detected leading 1 class of the intended AC or DC code table. This 9-bit address is added to the 7-bit memory address offset on bus 215 to provide on bus 217 a memory address which corresponds to the decoded Huffman codeword in the Huffman code table stored in 640X12 RAM 208. A table bit selects in RAM 208 which of the two sets of AC and DC tables to use. The 12-bit word addressed in RAM 208, i.e. the memory word specified by the table bit and the memory address of bus 217, comprises three fields: a runlength field, a size field and a Huffman code length field. The run length field specifies the number of zero AC coefficients encoded, the size field specifies the number of bits in the following non-zero DCT coefficient, and the Huffman code length field specifies the length of the Huffman code detected.

As mentioned above, the Huffman code length and the size fields of the decoded Huffman codeword are fed back to adder 211 to align the next word in the coded bit stream. The Huffman code length is also used in shifter 205 to align the non-zero DCT coefficient on 26-bit bus 213. This non-zero DCT coefficient is provided on 11-bit bus 222.

The above detailed description are provided to illustrate the specific embodiments of the present invention and is not intended to be limiting the present invention. Many variations and modifications within the scope of the present invention is possible. The present invention is defined by the following claims.

We claim:

1. A method for decoding a variable length codeword embedded in a bit stream, comprising the steps of:
   detecting the number of leading 1's in said variable length codeword;
   looking up from a first storage means (i) a "tail length" corresponding to the maximum number of bits following said number of leading 1's in said variable length codeword; and (ii) a first memory address;
   separating from said bit stream in accordance with said tail length a bit string including the bits of said codeword following said leading 1's;
   combining said first memory address and said bit string to form a second memory address; and
   using said second address to access a second storage means to obtain a decoded value of said codeword.

2. A method as in claim 1, wherein said step of separating further comprises the steps of:
   providing said bit string in a reversed order from the order the bits in said bit string are provided in said bit stream; and
   setting to zero in said bit string all bits not belonging to said codeword.

3. A method as in claim 2, wherein said step of combining comprises the step of adding said first memory address to said bit string.

4. A method as in claim 1, wherein said method further comprises, prior to said detecting step, the step of aligning in said bit stream said variable code by shifting out a variable code previously decoded.

5. A method as claim 1, wherein said second memory address selects a location in said second storage means from a number of memory locations no more than $2K - \lceil \log_2 K \rceil - 1$, where K is the number of all possible decoded values.

6. A method as in claim 1, wherein, when at least one bit follows said leading 1's in said codeword, a '0' bit follows in said codeword said leading 1's, and wherein said bit string does not include said '0' bit.

7. A structure for decoding a variable length codeword embedded in a bit stream, comprising:
   means for detecting the number of leading 1's in said variable length codeword;
   means for looking up from a first storage means (i) a "tail length" corresponding to the maximum number of bits following said number of leading 1's in said variable length codeword; and (ii) a first memory address;
   means for separating from said bit stream in accordance with said tail length a bit string including the bits of said codeword following said leading 1's;
   means for combining said first memory address and said bit string to form a second memory address; and
   means, using said second address, for accessing a second storage means to obtain a decoded value of said codeword.

8. A structure as in claim 7, wherein said means for separating further comprises:

means for providing said bit string in a reversed order from the order the bits in said bit string are provided in said bit stream; and means for setting to zero in said bit string all bits not belonging to said codeword.

9. A structure as in claim 8, wherein said means for combining comprises means for adding said first memory address to said bit string.

10. A structure as in claim 7, wherein said structure further comprises means for aligning in said bit stream said variable code by shifting out a variable code previously decoded.

11. A structure as claim 7, wherein said second memory address selects a location of said second storage means from a number of memory locations no more than $2K - \lceil \log_2 K \rceil - 1$, where K is the number of all possible decoded values.

12. A structure as in claim 7, wherein, when at least one bit follows said leading 1's in said codeword, a '0' bit follows in said codeword said leading 1's, and wherein said bit string does not include said '0' bit.

* * * * *